United States Patent
Kanamitsu (12) 
(10) Patent No.: US 9,383,641 B2
(45) Date of Patent: Jul. 5, 2016

(54) METHOD OF REPAIRING DEFECT AND METHOD OF MANUFACTURING SEMICONDUCTOR DEVICE

(71) Applicant: KABUSHIKI KAISHA TOSHIBA, Minato-ku, Tokyo (JP)

(72) Inventor: Shingo Kanamitsu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 14/192,671

(22) Filed: Feb. 27, 2014

(65) Prior Publication Data

US 2015/0072524 A1 Mar. 12, 2015

(30) Foreign Application Priority Data

Sep. 11, 2013 (JP) .................................. 2013-188841

(51) Int. Cl.
| | | |
|---|---|---|
| H01L 21/302 | (2006.01) | |
| G03F 7/00 | (2006.01) | |
| H01L 21/265 | (2006.01) | |
| H01L 21/02 | (2006.01) | |
| B29L 31/00 | (2006.01) | |

(52) U.S. Cl.
CPC ............ *G03F 7/0017* (2013.01); *G03F 7/0002* (2013.01); *H01L 21/02689* (2013.01); *H01L 21/26566* (2013.01); *B29L 2031/757* (2013.01)

(58) Field of Classification Search
CPC ................ G03F 7/0002; G03F 7/0017; H01L 21/02689; H01L 21/26566
USPC .......................................... 438/717, 725, 736
See application file for complete search history.

(56) References Cited

U.S. PATENT DOCUMENTS

| | | | | |
|---|---|---|---|---|
| 2004/0209172 | A1* | 10/2004 | Takaoka | ................... C03C 17/28 430/5 |
| 2011/0255773 | A1* | 10/2011 | Takahashi | ............... G06T 7/001 382/145 |
| 2012/0090489 | A1 | 4/2012 | Suzuki et al. | |
| 2012/0112370 | A1 | 5/2012 | Kobayashi | |
| 2012/0273458 | A1* | 11/2012 | Bret | ...................... B82Y 10/00 216/39 |
| 2014/0109785 | A1* | 4/2014 | Pauliac | .................. B82Y 10/00 101/450.1 |

FOREIGN PATENT DOCUMENTS

| | | |
|---|---|---|
| JP | 2004-251964 | 9/2004 |
| JP | 2005-44843 | 2/2005 |
| JP | 2008-185931 | 8/2008 |

(Continued)

OTHER PUBLICATIONS

Notice of Reasons for Refusal issued by the Japanese Patent Office on Oct. 20, 2015, for Japanese Patent Application No. 2013-188841, and English-language translation thereof.

(Continued)

*Primary Examiner* — Binh X Tran
(74) *Attorney, Agent, or Firm* — Finnegan, Henderson, Farabow, Garrett & Dunner LLP (57) ABSTRACT

According to one embodiment, in a method of repairing a defect on a template substrate for imprint lithography using a charged particle beam, a drift correction mark to correct drift of the charged particle beam is formed on the template substrate. The defect on the template substrate is repaired while correcting the drift of the charged particle beam with reference to the drift correction mark. The drift correction mark is removed.

15 Claims, 5 Drawing Sheets

(56) References Cited

FOREIGN PATENT DOCUMENTS

| | | |
|---|---|---|
| JP | 2012-126113 | 7/2012 |
| JP | 2013-30522 | 2/2013 |
| JP | 2013-110330 | 6/2013 |
| JP | 2014-519046 | 8/2014 |
| JP | 2014-204074 | 10/2014 |
| WO | WO 2012140106 A1 * | 10/2012 ............. B82Y 10/00 |

OTHER PUBLICATIONS

Decision of Refusal issued by the Japanese Patent Office dated Mar. 8, 2016, for Japanese Patent Application No. 2013-188841, and English-language translation thereof.

* cited by examiner

METHOD OF REPAIRING DEFECT AND METHOD OF MANUFACTURING SEMICONDUCTOR DEVICE

CROSS REFERENCE TO RELATED APPLICATION

This application is based upon and claims the benefit of priority from the prior Japanese Patent Application 2013-188841, filed on Sep. 11, 2013, the entire contents of which are incorporated herein by reference.

FIELD

Embodiments described herein are generally related to a method of repairing a defect and a method of manufacturing a semiconductor device.

BACKGROUND

A defect of a photo-mask is generally repaired using a charged particle beam such as an electron beam and an ion beam. In order to correct drift of the charged particle beam, a drift correction mark is formed on the photo-mask, and the drift correction mark is used as a reference mark.

The drift correction mark is usually a silicon oxide film which uses TEOS (Tetra Ethyl Ortho Silicate) as materials. In addition, the drift correction mark is formed on a mask pattern, so as not to cause a problem even if the drift correction mark remains on the photo-mask after repairing the defect. That is, the drift correction mark is formed so that the whole pattern of the drift correction mark is located inside the mask pattern.

In the case of repairing a defect of a template for imprint lithography, it is possible to apply a method using a charged particle beam as described above. However, in the case of forming a drift correction mark on the template, the following problem occurs.

Since, in imprint lithography, pattern transfer is performed with the same magnification, a size of the drift correction mark becomes larger than a size of the template pattern. That is, the whole pattern of the drift correction mark cannot be completely included inside the template pattern.

When the drift correction mark remains on the template after repairing the defect, the remaining drift correction mark may emerge as a defect at imprint lithography.

Accordingly, a precise method of repairing a defect on a template using a drift correction mark is desired.

DETAILED DESCRIPTION

According to one embodiment, in a method of repairing a defect on a template substrate for imprint lithography using a charged particle beam, a drift correction mark to correct drift of the charged particle beam is formed on the template substrate. The defect on the template substrate is repaired while correcting the drift of the charged particle beam with reference to the drift correction mark. The drift correction mark is removed.

Embodiments will be described below with reference to the drawings. In the drawings, the same reference numerals show the same or similar portions. The same portions in the drawings are denoted by the same numerals and a detailed explanation of the same portions is appropriately omitted, and different portions will be described.

(Embodiment)

Figure 1:
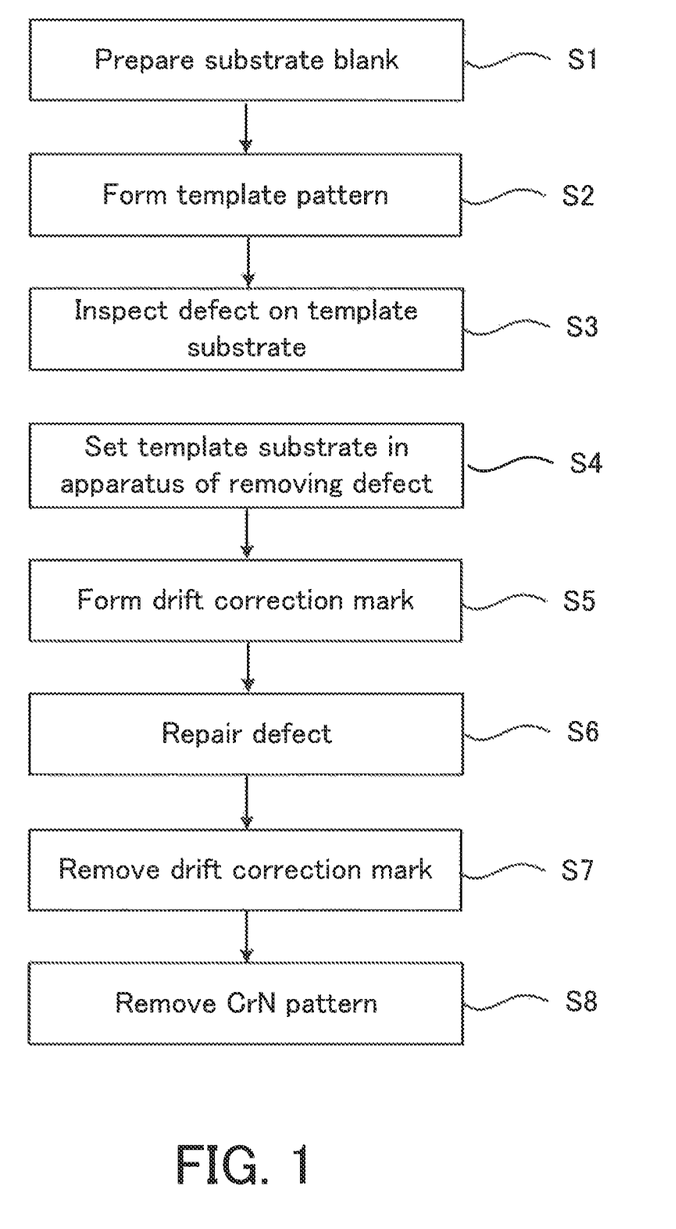
FIG. 1 is a flowchart showing a method of repairing a defect according to an embodiment.

FIG. 1 is a flowchart showing a method of repairing a defect in accordance with an embodiment.

To begin with, a substrate blank is prepared in order to form a template for imprint lithography (S1). The substrate blank is obtained by forming a CrN film on a quartz substrate as an etching mask film. The CrN film has a thickness of 3 nm, for example. The quartz substrate has a 6-inch square and a thickness of 0.25 inches, for example.

A template pattern for a circuit pattern is formed on the substrate blank (S2). Specifically, chemically-amplified resist is applied on the substrate blank. A circuit pattern is drawn on the chemically-amplified resist using an electron beam drawing apparatus. A line and space pattern with a half pitch of 20 nm is drawn, for example. The chemically-amplified resist is developed, to form a resist pattern. The CrN film is etched with chlorine-based process using the resist pattern as a mask. The quartz substrate is etched with a fluorine-based process using the pattern of the CrN film as a mask. An etching depth of the quartz substrate is assumed to be approximately two times (approximately 40 nm) of the half pitch (20 nm). Furthermore, cleaning and the like are performed.

Figure 2A:
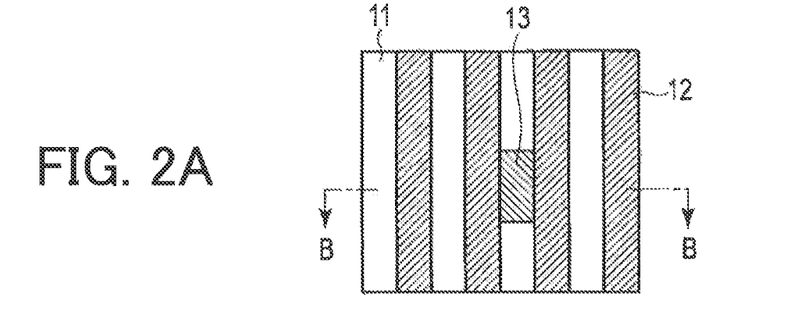
FIGS. 2A and 2B are views schematically showing a configuration of a template substrate according to the embodiment.
Figure 2B:
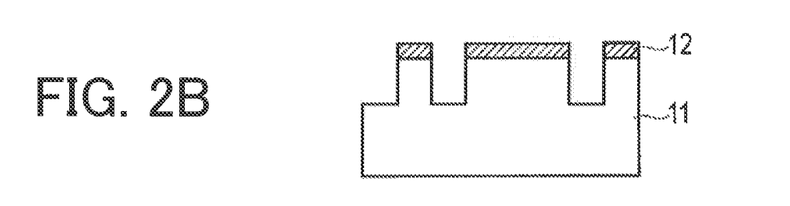

In this way, a template substrate shown in FIGS. 2A, 2B is obtained. FIG. 2A is a plan view, and FIG. 2B is a sectional view taken along a line B-B of FIG. 2A. In FIG. 2A and FIG. 2B, 11 denotes a quartz substrate, 12 denotes a CrN pattern (an etching mask pattern), and 13 denotes a defect (a defect of the CrN pattern) described later. In addition, in the specification, a substrate on which a template pattern (grooves of a template pattern) is formed is referred to as a template substrate. Accordingly, the substrate on which the CrN pattern 12 is remaining as shown in FIGS. 2A, 2B, and the substrate from which the CrN pattern 12 has been removed as described later is referred to as a template substrate, in the specification and the scope of claims.

A defect inspection of the template substrate obtained as described above is performed (S3). Specifically, a defect inspection using an electron beam, or a defect inspection using ultraviolet light having a wavelength in a dUV (a deep-ultraviolet) range is performed. It is assumed that the defect 13 shown in FIG. 2A is detected by the defect inspection. When a foreign substance adheres to the surface of the CrN film, a portion of the CrN film to which the foreign substance adheres is hard to be etched. As a result, the defect 13 is formed when the CrN film is etched to form the CrN pattern 12. Generally, there exist approximately several tens of the defects on the surface of the CrN film.

Figure 3:
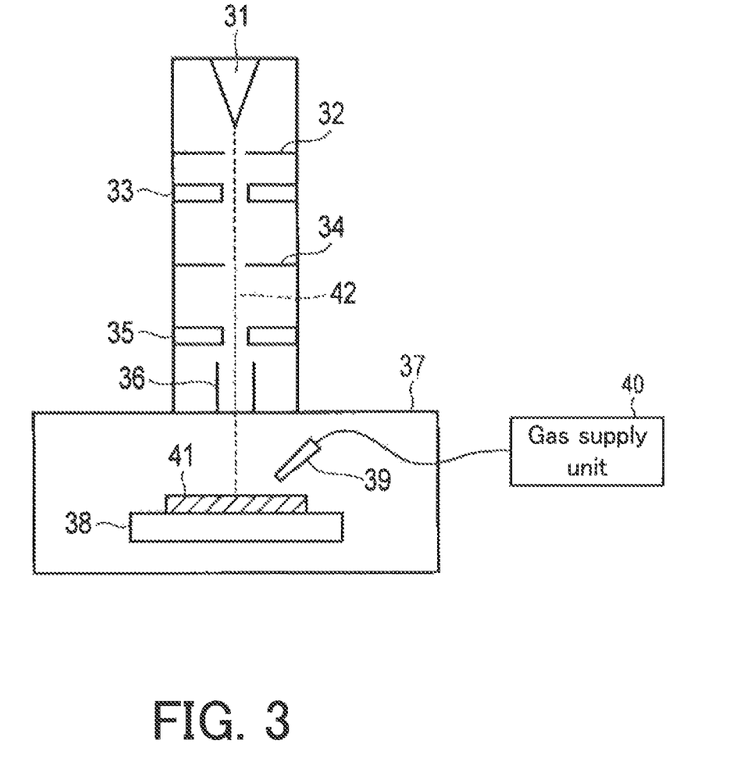
FIG. 3 is a diagram schematically showing a configuration of an apparatus of repairing a defect according to the embodiment.

The template substrate having the defect 13 is set in an apparatus of repairing a defect (S4). FIG. 3 is a diagram schematically showing a configuration of the apparatus of repairing the defect. The apparatus of repairing the defect has the same configuration as a SEM (a scanning electron microscope). Specifically, the apparatus of repairing the defect is provided with an electron gun 31, an aperture 32, a convergence lens 33, an aperture 34, an object lens 35, a scanner 36, a vacuum chamber 37, an X-Y stage 38, and a nozzle 39. A gas supply unit 40 to supply desired gas to the nozzle 39 is disposed outside the vacuum chamber 37. 41 denotes the template substrate, and 42 denotes an electron beam (a charged particle beam). In addition, the one nozzle 39 is drawn in FIG. 3, but actually, the two or more nozzles 39 are provided respectively for two or more supply gases.

A drift correction mark is formed on the template substrate (S5). The drift correction mark will be described. The repair of the above-described defect is performed using a charged particle beam such as an electron beam. The drift correction mark is formed so as to correct the drift of the charged particle beam. Cause for the drift of the charged particle beam is roughly classified into two modes. A first mode is caused by displacement of the position of the substrate or the stage against the beam axis due to a mechanical factor. A second mode is that the beam deviates from the normal orbit by the action of peripheral electric field due to charge-up and so on. Hereinafter, forming the drift correction mark will be described.

The X-Y stage 38 is driven, to adjust so that the position of the defect to be repaired coincides with the center of the electron beam axis. A secondary electron image is obtained within the region with a size of approximately several micrometers ($\mu$m), and the defect is moved to the center of the eyesight. The drift correction mark is formed by CVD (Chemical vapor Deposition) method using an electron beam (charged particle beam).

Figure 4A:
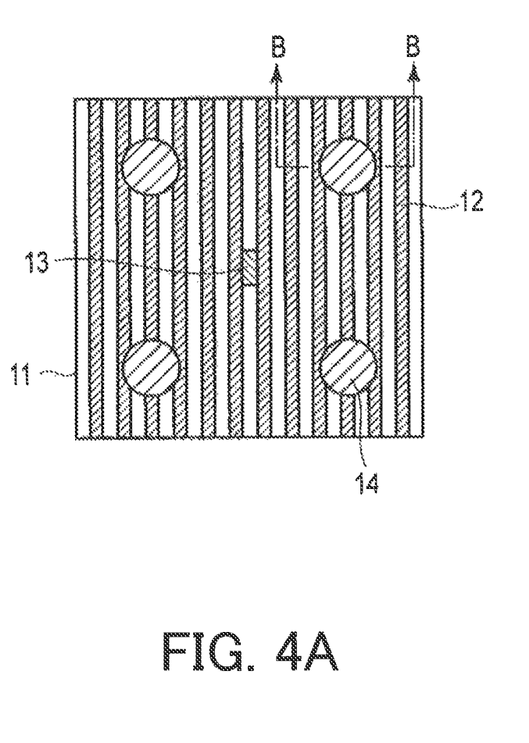
FIGS. 4A and 4B are schematic views showing drift correction mark according to the embodiment.
Figure 4B:
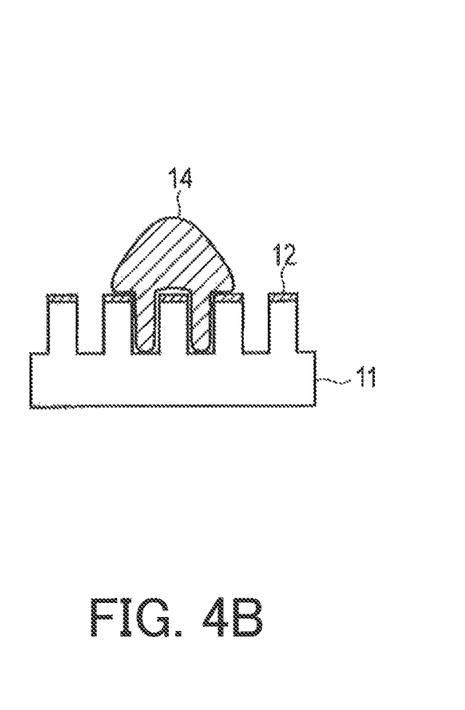

FIG. 4A is a plan view showing a drift correction mark, and FIG. 4B is a sectional view taken along a line B-B of FIG. 4A. 11 denotes the quartz substrate, 12 denotes the CrN pattern (etching mask pattern), 13 denotes the defect of the CrN pattern, and 14 denotes a drift correction mark. In the embodiment, the four dot-shaped drift correction marks 14 are formed around the defect 13 as a center. In addition, it is satisfactory that the drift correction mark 14 may be one or more.

Molybdenum (Mo) or material containing molybdenum as a main component is used for the drift correction mark 14. When the drift correction mark 14 is formed, gas containing molybdenum is supplied from the gas supplying unit 40 into the vacuum chamber 37 through the nozzle 39, and deposition reaction due to electron excitation is utilized. Molybdenum hexacarbonyl is used as the gas containing molybdenum. A diameter and a height of the drift correction mark 14 are approximately 50 nm, and approximately 50 to 100 nm, respectively. When the drift correction mark has the size of this extent, the drift correction mark can be observed with a sufficient position accuracy using the optical system of the SEM composing the apparatus of repairing the defect. In addition, since the drift correction mark 14 needs to have the size of a diameter of not less than about 50 nm, the drift correction mark 14 is formed also at the outside of the line pattern (CrN pattern). The drift correction mark 14 extends to the outside of the line pattern adjacent.

The defect 13 of the template substrate is repaired, while correcting the drift of the electron beam (charged particle beam) with reference to the drift correction marks 14 (S6). Hereinafter, a method of repairing the defect 13 will be described.

The gas capable of etching the defect 13 is supplied from the gas supplying unit 40 into the vacuum chamber 37 through the nozzle 39, the defect 13 is irradiated with the electron beam, and thereby the repair of the defect 13 is performed. At the time of etching CrN, chlorine based gas is used, and at the time of etching the quartz substrate, fluorine based gas is used.

The repair of the defect is performed referring to the drift correction mark 14 so as to correct the drift of the electron beam. Specifically, the position relation (a distance in the X direction and a distance in the Y direction) between the defect 13 and the drift correction mark 14 is previously obtained. After the defect 13 has been irradiated with the electron beam of a prescribed amount from the electron gun 31, the position of the drift correction mark 14 is observed. And a displacement from the previously obtained position relation is obtained. It is assumed that a displacement amount in the X direction is $\Delta X$, and a displacement amount in the Y direction is $\Delta Y$, for example. After the position correction is performed by adding $-\Delta X$ and $-\Delta Y$ as correction amounts, irradiation of the electron beam is carried out to the defect 13. Repair of the defect is performed, while the electron beam is reciprocated between the defect 13 and the drift correction mark 14 two or more times. The drift correction of the electron beam is performed with reference to the drift correction mark 14, and thereby the repair of the defect can be performed with excellent in position accuracy.

The drift correction mark 14 is removed (S7). The removal of the drift correction mark 14 is performed using etchant which can selectively etch the drift correction mark 14 against the template substrate. That is, etching of the drift correction mark 14 is performed using etchant which can selectively etch the drift correction mark 14 against the quartz substrate 11 and the CrN pattern 12. In addition, the removal of the drift correction mark 14 is performed by supplying the etchant to the whole surface of the template substrate, the defect 13 being on the surface of the template substrate. That is, the etchant is supplied to not only the drift correction mark 14, but also to the whole surface of the template substrate. Hereinafter, the removal of the drift correction mark will be specifically described.

The template substrate whose defect has been repaired is taken out from the apparatus of repairing the defect, and is set in an apparatus of cleaning. As the etchant, a solution which is easy to oxidize molybdenum and dissolve oxidized molybdenum is used. A mixed solution of sulfuric acid and hydrogen peroxide water can be used as the etchant, for example. Ozone water can be used as the etchant. Further, gas which is easy to oxidize molybdenum and remove oxidized molybdenum can be used as the etchant.

Finally, the CrN pattern 12 is removed (S8). The template for imprint lithography is completed.

As described above, in the embodiment, after repairing the defect using the drift correction mark, the drift correction mark is selectively etched against the template substrate, to thereby be removed. The drift correction mark does not remain on the template, and the defect is accurately repaired. Since the drift correction mark does not remain on the template, the drift correction mark may not be included within the CrN pattern. Accordingly, the drift correction mark can be formed without restriction of the size.

The removal of the drift correction mark is performed by supplying the etchant to the whole surface of the template substrate, the defect being on the surface of the template substrate. That is, the etchant is not supplied to only the drift correction mark. Accordingly, it is not necessary to accurately control the supply position of the etchant. Since the supply of the etchant is easily performed, the removal of the drift correction mark can be easily performed.

The drift correction mark is formed by CVD method using a charged particle beam such as an electron beam. Accordingly, the drift correction mark can be accurately formed at a desired position.

Figure 5:
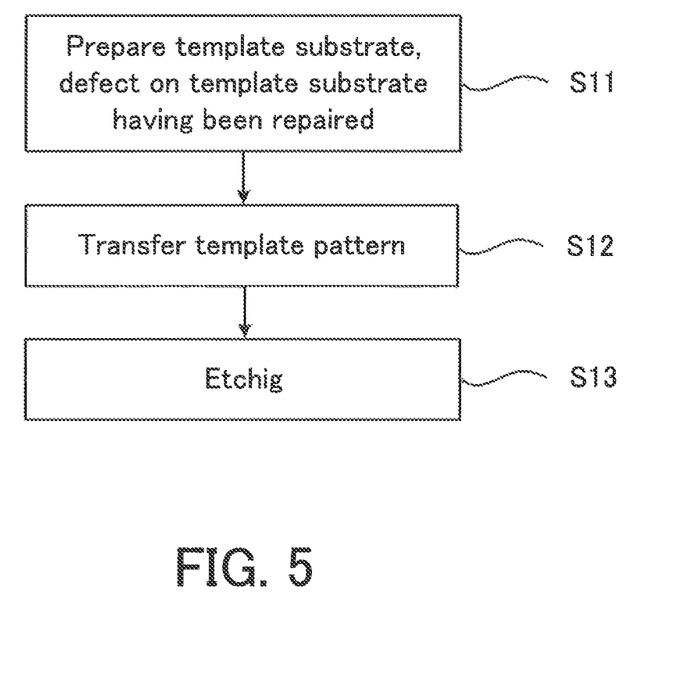
FIG. 5 is a flowchart showing a method of manufacturing a semiconductor device according to the embodiment.

The template corrected with the method of repairing the defect in above-described embodiment can be applied to a manufacture of a semiconductor device. FIG. 5 is a flow chart showing a method of manufacturing a semiconductor device.

The template whose defect has been repaired with the above-described method is prepared (S11). Subsequently, the template pattern formed on the template is transferred to a resist on a semiconductor substrate by imprint lithography, to form a resist pattern (S12). Etching is performed using the resist pattern as a mask, to form a desired pattern on the semiconductor substrate (S13).

In the embodiment described above, the drift correction mark has been formed on the template substrate on which the CrN pattern (etching mask pattern) remains. However, the drift correction mark may be formed on the template substrate after removing the CrN pattern (etching mask pattern). In this case, the same effect as the above-described effect may be obtained.

In the embodiment described above, the material containing molybdenum (Mo) as the main component has been used for the drift correction mark.

However, material containing an element selected from a group including molybdenum (Mo), chromium (Cr), nickel (Ni), iron (Fe), tungsten (W), vanadium (V), manganese (Mn), aluminum (Al) and zinc (Zn) as a main component can be used for the drift correction mark. The above-described element may be solely used, or a compound of the above-described element (an oxide of the above-described element, for example) may be used.

When material containing molybdenum (Mo) as a main component is used for the drift correction mark, gas of $Mo(CO)_6$ can be used for forming the drift correction mark. In addition, when the drift correction mark is removed, etchant containing at least one of concentrated sulfuric acid, nitric acid, aqua regia, hydrogen peroxide water, ozone water and ammonia water can be used.

When material containing chromium (Cr) as a main component is used for the drift correction mark, gas of $Cr(CO)_6$ can be used as the gas for forming the drift correction mark. In addition, when the drift correction mark is removed, cerium ammonium nitrate can be used.

When material containing nickel (Ni) as a main component is used for the drift correction mark, gas of $Ni(CO)_4$ can be used for forming the drift correction mark. In addition, when the drift correction mark is removed, etchant containing at least one of diluted nitric acid, hydrogen peroxide water and ozone water can be used.

When material containing iron (Fe) as a main component is used for the drift correction mark, gas of $Fe(CO)_5$, $Fe_3(CO)_{12}$, or $Fe_2(CO)_9$ can be used for forming the drift correction mark. In addition, when the drift correction mark is removed, etchant containing at least one of hydrochloric acid, sulfuric acid, hydrogen peroxide water and ozone water can be used.

When material containing tungsten (W) as a main component is used for the drift correction mark, gas of $W(CO)_6$ can be used for forming the drift correction mark. In addition, when the drift correction mark is removed, etchant containing at least one of hydrogen peroxide water, ozone water and alkali nitrite can be used.

When material containing vanadium (V) as a main component is used for the drift correction mark, gas of $V(CO)_6$ for forming the drift correction mark can be used. In addition, when the drift correction mark is removed, it is possible to use etchant containing at least one of concentrated nitric acid and concentrated sulfuric acid.

When material containing manganese (Mn) as a main component is used for the drift correction mark, gas of $Mn_2(CO)_{10}$ for forming the drift correction mark can be used. In addition, when the drift correction mark is removed, etchant containing at least one of diluted hydrochloric acid, diluted sulfuric acid, hydrogen peroxide water and ozone water can be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of repairing a defect on a template substrate for imprint lithography using a charged particle beam, the method comprising:
    forming a drift correction mark on the template substrate to correct drift of the charged particle beam, a size of the drift correction mark being larger than a width of a line pattern provided on the template substrate;
    repairing the defect on the template substrate while correcting the drift of the charged particle beam with reference to the drift correction mark; and
    removing the drift correction mark.

2. The method of repairing the defect according to claim 1, wherein
    the drift correction mark is removed using etchant capable of selectively etching the drift correction mark against the template substrate.

3. The method of repairing the defect according to claim 1, wherein
    the drift correction mark is removed by supplying etchant to a whole surface of the template substrate, the defect being on the surface of the template substrate.

4. The method of repairing the defect according to claim 1, wherein
    the drift correction mark is formed by chemical vapor deposition method.

5. The method of repairing the defect according to claim 1, wherein
    the drift correction mark includes at least one element selected from the group consisting of molybdenum (Mo), chromium (Cr), nickel (Ni), iron (Fe), tungsten (W), vanadium (V), manganese (Mn), aluminum (Al) and zinc (Zn).

6. A method of manufacturing a semiconductor device, comprising:
    transferring a template pattern of a template substrate to a semiconductor substrate, a defect on the template substrate having been repaired with a method to;
        form a drift correction mark to correct drift of a charged particle beam on the template substrate, a size of the drift correction mark being larger than a width of a line pattern provided on the template substrate;
        repair the defect on the template substrate while correcting the drift of the charged particle beam with reference to the drift correction mark; and
        remove the drift correction mark.

7. The method of manufacturing the semiconductor device according to claim 6, wherein
    the drift correction mark is removed using etchant capable of selectively etching the drift correction mark against the template substrate.

8. The method of manufacturing the semiconductor device according to claim 6, wherein
the drift correction mark is removed by supplying etchant to a whole surface of the template substrate, the defect being on the surface of the template substrate.

9. The method of manufacturing the semiconductor device according to claim 6, wherein
the drift correction mark is formed by chemical vapor deposition method.

10. The method of manufacturing the semiconductor device according to claim 6, wherein
the drift correction mark includes at least one element selected from the group consisting of molybdenum (Mo), chromium (Cr), nickel (Ni), iron (Fe), tungsten (W), vanadium (V), manganese (Mn), aluminum (Al) and zinc (Zn).

11. A method of manufacturing a semiconductor device, comprising:
preparing a template substrate having a template pattern, a defect on the template substrate having been repaired with a method to:
form a drift correction mark to correct drift of a charged particle beam on the template substrate, a size of the drift correction mark being larger than a width of a line pattern provided on the template substrate;
repair the defect on the template substrate while correcting the drift of the charged particle beam with reference to the drift correction mark; and
remove the drift correction mark;
transferring the template pattern to a resist on a semiconductor substrate; and
etching the semiconductor substrate using the resist as a mask.

12. The method of manufacturing the semiconductor device according to claim 11, wherein
the drift correction mark is removed using etchant capable of selectively etching the drift correction mark against the template substrate.

13. The method of manufacturing the semiconductor device according to claim 11, wherein
the drift correction mark is removed by supplying etchant to a whole surface of the template substrate, the defect being on the surface of the template substrate.

14. The method of manufacturing the semiconductor device according to claim 11, wherein
the drift correction mark is formed by chemical vapor deposition method.

15. The method of manufacturing the semiconductor device according to claim 11, wherein
the drift correction mark includes at least one element selected from the group consisting of molybdenum (Mo), chromium (Cr), nickel (Ni), iron (Fe), tungsten (W), vanadium (V), manganese (Mn), aluminum (Al) and zinc (Zn).

* * * * *